United States Patent [19]
Takai et al.

[11] Patent Number: 4,797,735
[45] Date of Patent: Jan. 10, 1989

[54] DISTORTION SURVEILLANCE APPARATUS FOR TELEVISION SIGNAL TRANSMISSION SYSTEM

[75] Inventors: Hitoshi Takai, Hirakata; Noriaki Morotomi, Fujisawa, both of Japan

[73] Assignee: Matsushita Electric Industrial Co., Ltd., Osaka, Japan

[21] Appl. No.: 881,832

[22] Filed: Jul. 2, 1986

[30] Foreign Application Priority Data

Jul. 4, 1985 [JP] Japan .................................. 60-147538
Jul. 4, 1985 [JP] Japan .................................. 60-147551
Jul. 4, 1985 [JP] Japan .................................. 60-147552

[51] Int. Cl.⁴ ............................................. H04N 7/10
[52] U.S. Cl. ..................................................... 358/86
[58] Field of Search ....................... 358/86, 139; 379/6

[56] References Cited

U.S. PATENT DOCUMENTS

| | | | |
|---|---|---|---|
| 3,862,380 | 1/1975 | Hekimian et al. | 379/6 |
| 3,927,281 | 12/1975 | Bradley | 379/6 X |
| 3,978,282 | 8/1976 | Fulton, Jr. | 379/6 X |
| 4,365,346 | 12/1982 | Froese et al. | |
| 4,491,968 | 1/1985 | Shimp et al. | 358/86 X |
| 4,700,222 | 10/1987 | Large et al. | 358/86 |

FOREIGN PATENT DOCUMENTS

| | | |
|---|---|---|
| 210007 | 1/1987 | European Pat. Off. |
| 1019707 | 11/1957 | Fed. Rep. of Germany |
| 1076174 | 2/1960 | Fed. Rep. of Germany |
| 2111817 | 9/1972 | Fed. Rep. of Germany |
| 2339981 | 7/1974 | Fed. Rep. of Germany |
| 3511274 | 10/1986 | Fed. Rep. of Germany |
| 50-33723 | 4/1975 | Japan |

Primary Examiner—Keith E. George
Attorney, Agent, or Firm—Wenderoth, Lind and Ponack

[57] ABSTRACT

In a transmission system of signals including amplitude-modulated television signals, a pilot signal of a specific amplitude is supplied at a first place in the transmission system, and at a second place in the transmission system, the pilot signal having been subjected to a cross modulation due to nonlinearity of the transmission system from the first place to the second place is extracted. A rectifier picks up an envelope of the cross modulated pilot signal. In consequence, out of the envelope, the fundamental wave component or a higher harmonic component of the horizontal scanning frequency of the transmitted television signal is extracted by using a filter of an extremely narrow band. By detecting the increase in the level of this removed signal, an increase in distortion due to an excessive level of the transmission signal which causes a problem in the transmission system is detected.

21 Claims, 12 Drawing Sheets

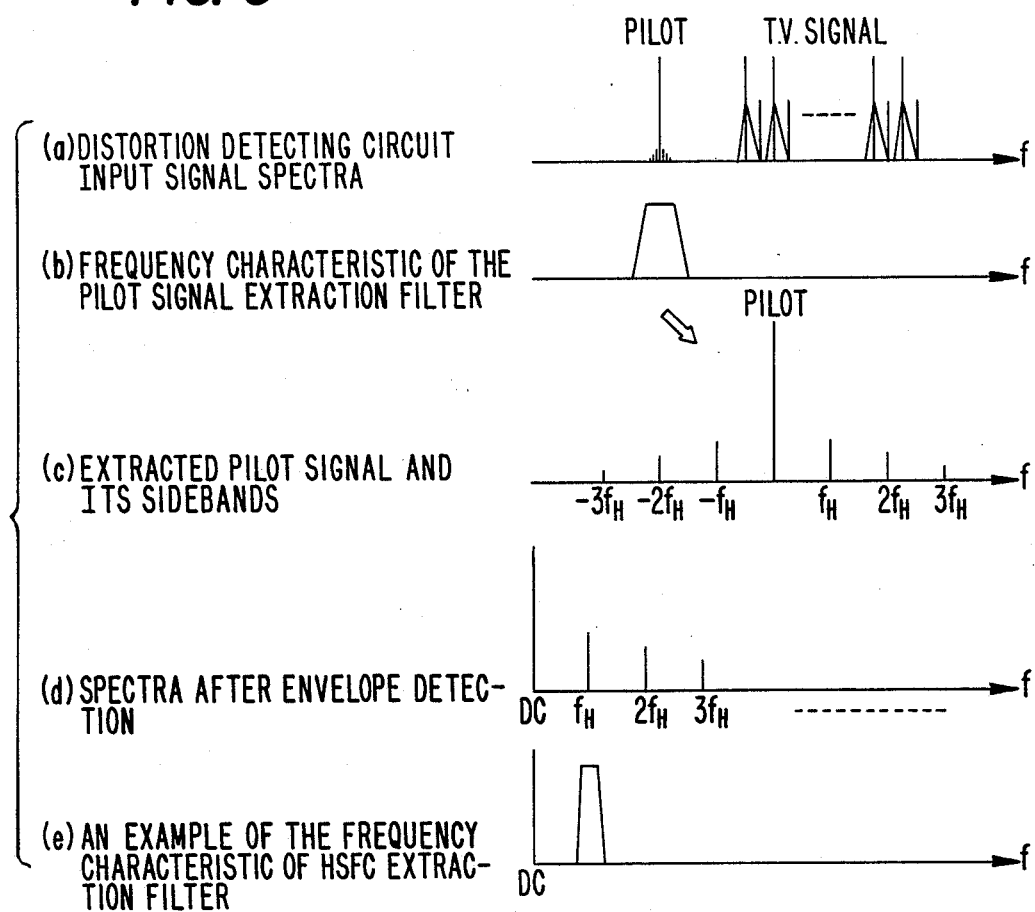
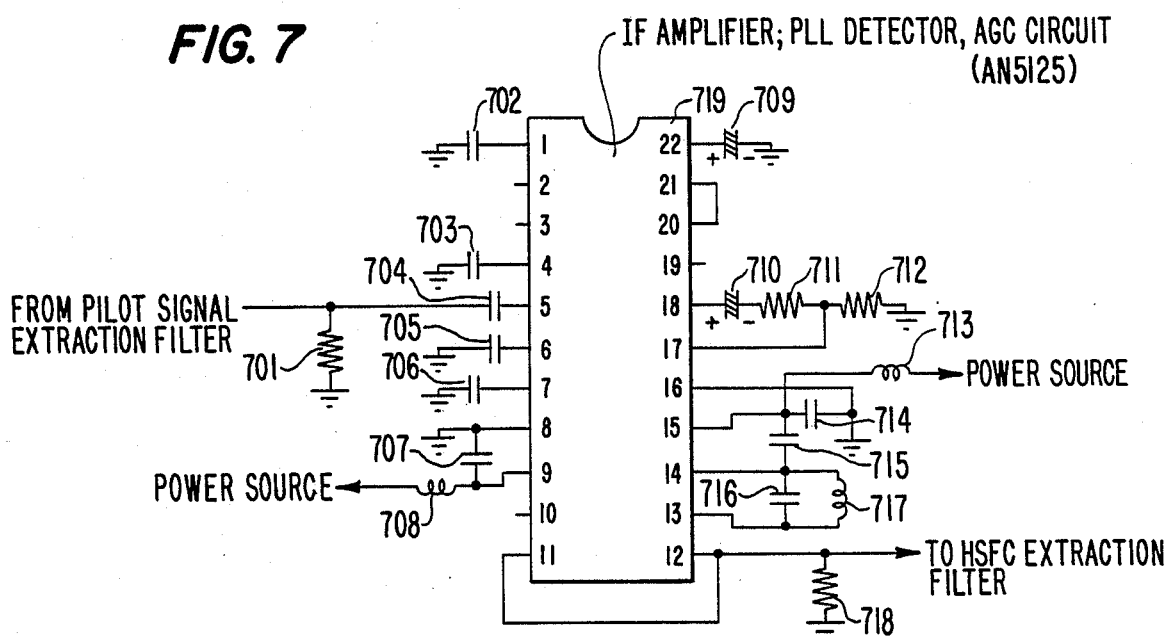

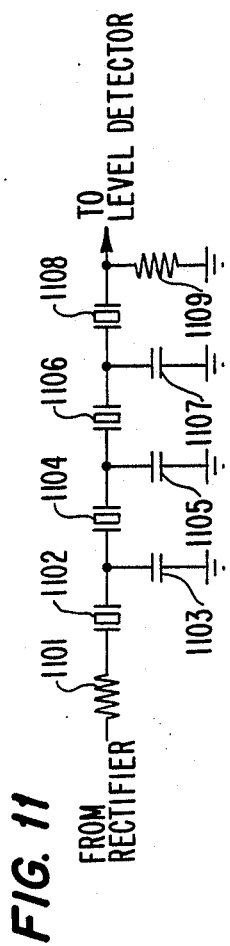

DISTORTION SURVEILLANCE APPARATUS FOR TELEVISION SIGNAL TRANSMISSION SYSTEM

BACKGROUND OF THE INVENTION

1. Field of the Invention

This invention relates to a distortion surveillance apparatus for detecting an abnormal increase of signal distortion occurring in a trunk amplifier or the like used in the transmission system of television signals such as a CATV system.

2. Description of the Prior Art

Recently, CATV systems have tended to have a large number of channels. Accordingly, a particularly low distortion characteristic is required for the signal transmission system, especially for the trunk amplifier. On the other hand, since CATV systems have tended to also have a large number of subscribers and a large service area, the number of trunk amplifiers have increased. In such circumstances, the main factor which lowers the reliability of the CATV transmission system is mostly related to the trunk amplifiers, which have active elements.

As one of the problems relating to a trunk amplifier, an increase in signal distortion due to excessive signal levels in the amplifier is known. If the occurrence of such an increase in signal distortion can be detected earlier and the defective position can be identified, the time required to restore the system can be reduced. Such a function can be realized by a remote-monitoring distortion surveillance apparatus.

Conventionally, to discover such problems an increase in the signal distortion, a pilot signal of a specific frequency is transmitted, and the level of the pilot signal is detected at the input or output of the trunk amplifier, so as to thereby determine whether or not the transmitted television signal level is proper. Based on this determination, an excessive signal level is detected, thereby indirectly discovering the problem causing the increase in the signal distortion. Such a problem detecting unit is installed in the trunk amplifier, and has a one-way or two-way communication function. The status of each trunk amplifier is generally surveyed by exchanging data with the surveillance terminal installed at the head end or at another location (see, for example, Japanese Unexamined Patent Publication No. 50-33723).

In such method, however, it may not be always possible to detect the distortion which occurs when the input of the line amplifier becomes excessive at a certain frequency due to a disturbance of the in-band frequency characteristics. This is because the detecting unit is responsive only to the frequency of the pilot signal. Or, if the line amplifier has a push-pull construction, the trouble cannot be detected when the distortion is increased due to a problem in the line amplifier itself, such as an improper balance of this unit, while the pilot signal level is normal.

SUMMARY OF THE INVENTION

It is hence a primary object of this invention to provide a distortion surveillance apparatus capable of detecting directly and accurately an occurrence of a problem with television signals due to an increase in the signal distortion.

To achieve this object, a distortion surveillance apparatus in accordance with the present invention used in a transmission system for signals including a television signal, comprises: a pilot signal generator for generating a pilot signal; a combining network for feeding the pilot signal to a first specified position in the transmission system; a splitter for splitting from a second specified position in the transmission system a transmitted signal containing the pilot signal which has been subjected to a cross modulation with the television signal via a non-linearity of the transmission system between the first and second specified positions; and a distortion detecting means for detecting an occurrence of abnormal signal distortion increase from the cross modulated pilot signal. The distortion detecting means comprises a first extraction filter for extracting the cross modulated pilot signal from the split signal; a rectifier for obtaining an envelope of the cross modulated pilot signal; a second extraction filter for extracting from the envelope at least a signal component of a horizontal scanning frequency of television signal and its harmonic components; a level detector for detecting a level of a signal extracted by the extraction filter; and a judging circuit for producing a signal indicating the occurrence of an abnormal signal distortion increase when the level detected by the level detector becomes abnormally large. With this arrangement, a problem in the transmission system due to an abnormal increase in the signal distortion can be accurately detected.

BRIEF DESCRIPTION OF THE DRAWINGS

FIG. 5 shows the frequency spectra of signals of various elements shown in FIG. 3;

FIG. 6 and FIG. 7 are circuit diagrams respectively showing examples of the pilot signal amplifier 402 and rectifier 403 shown in FIG. 4;

FIG. 10, FIG. 11, FIG. 12, and FIG. 13 are circuit diagrams of examples of the horizontal scanning frequency component (HSFC) extraction filter 302 shown in FIG. 3;

FIG. 21 and FIG. 22 are block diagrams showing the pilot signal extraction rectifier 301 of the second embodiment;

DESCRIPTION OF THE PREFERRED EMBODIMENTS

Figure 1:
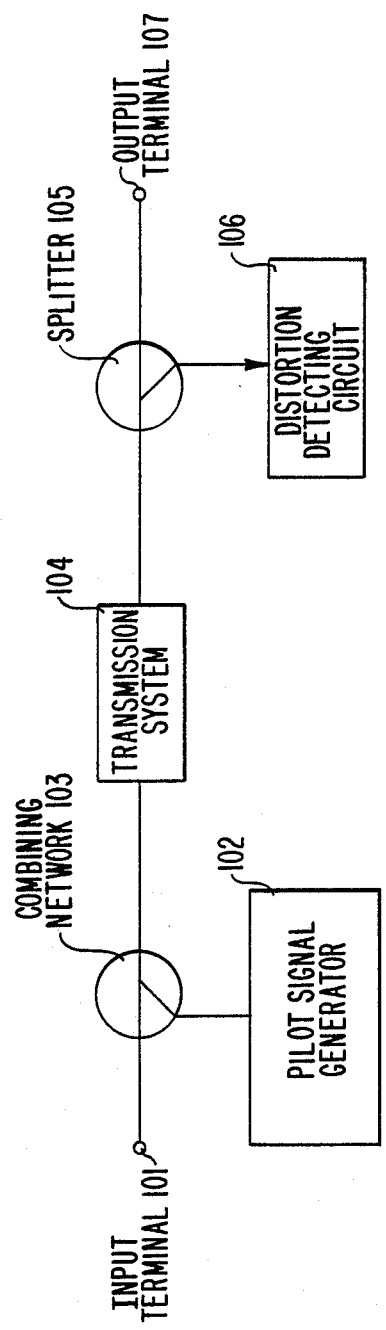
FIG. 1 is a block diagram showing a distortion surveillance apparatus according to a first embodiment of this invention.

FIG. 1 is a block diagram showing a construction of a distortion surveillance apparatus according to a first embodiment of this invention.

In FIG. 1, element 101 is an input terminal; element 102 is a pilot signal generator; element 103 is a combining network; element 104 is a transmission system; element 105 is a splitter; element 106 is a distortion detecting circuit, and element 107 is an output terminal.

The route from input terminal 101 to output terminal 107 by way of combining network 103, transmission system 104, and splitter 105, forms an entire transmission system, or makes up a part of it. The transmission signal contains an amplitude-modulated television signal.

The transmission system 104 is an object of surveillance for distortion by means of the distortion surveillance apparatus. The transmission system 104 is either a radio system or a wire system, or a combined form of the two. The portion of the wire system may be either coaxial cable or an optical fiber, or a combination of them. Or, without containing a transmission line, the transmission system 104 may be only composed of an amplifier or a nonlinear element which may generate distortion.

The pilot signal generator 102 generates sine waves of a specific amplitude at a frequency not overlapping the transmission signal supplied from the input terminal 101, and is capable of passing through the transmission system 104, that is, within the transmission band.

The pilot signal introduced through the combining network 103 passes through the transmission system 104 together with the transmission signal containing the television signal.

When a signal passes through the transmission system 104 which is not linear, the output includes components other than input signal components. Suppose the input signal x is expressed as:

$$x = A \cos at + B \cos bt \quad (1)$$

the the component corresponding to the so-called third order distortion, $x^3$, may be expressed by using eq. (1) as follows:

$$\begin{aligned} x^3 &= (A \cos at + B \cos bt)^3 \\ &= 1/4 \, (A^3 \cos 3at + B^3 \cos 3bt) + \\ &\quad 3/4 \, \{A^2 B \cos (2a \pm b)t + AB^2 \cos (2b \pm a)t\} + \\ &\quad 3/4 \, (A^3 \cos at + B^3 \cos bt) + \\ &\quad 3/2 \, (AB^2 \cos at + BA^2 \cos bt) \end{aligned} \quad (2)$$

At the right side of eq. (2), the first term is the third order harmonic component, the second term is an intermodulation component, the third term is a fundamental wave nonlinear component, and the fourth term is a cross modulation component. Furthermore, at the right side of eq. (1), supposing the first term to be an unmodulated pilot signal and the second term to be a television signal, the video base band signal may be expressed in terms of s(t) as follows:

$$B = 1 + s(t) \quad (3)$$

where A, a, b are constants. The component $AB^2 \cos$, which is a cross modulation component, may be expressed by using eq. (3) as follows:

$$AB^2 \cos at = A(s(t)^2 + s(t) + 1) \cos at \quad (4)$$

This means that video base band signal component and its secondary distortion component appear in the pilot signal envelope of the output of the transmission system 104. On the other hand, the video base band signal s(t) has a very strong component in the horizontal scanning frequency and the frequency of its integer multiples. Therefore, by detecting the envelope of the output signal of the transmission system 104 and also detecting the increase of the level of frequency component of the horizontal scanning frequency of its integer multiple, the increase of distortion of the transmission system 104 can be detected. What must be noted here is that the method of detection of this distortion surveillance apparatus of the invention is not related with the frequency of the transmission signal or frequency of the pilot signal. Hence, at any frequency within the transmission band, distortion occurring due to an excess level can be detected. This principle also holds true if the transmission signal applied to the input terminal 101 includes a plurality of television signals.

The output signal from the transmission system 104 is divided by the splitter 105, and enters the distortion detecting circuit 106. In the distortion detecting circuit 106, the cross-modulated pilot signal is extracted, and the envelope is detected, and the horizontal scanning frequency signal or its higher harmonic component is removed by a filter having a steep characteristic. By detecting the level of the output signal from this filter, it is determined that the distortion increase is abnormal when this level is abnormally elevated.

The pilot signal generator 102 and distortion detecting circuit 106 are described below in greater detail.

Figure 2:
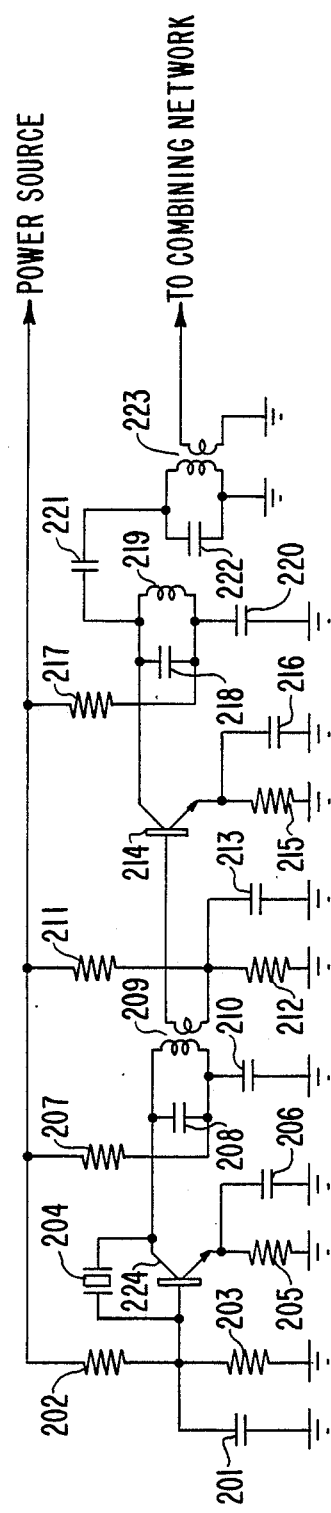
FIG. 2 is a circuit diagram showing an example of the pilot signal generator 102 shown in FIG. 1.

FIG. 2 shows an example of pilot signal generator, in which elements 202, 203, 205, 211, 212 and 215 are resistors for bias; elements 206, 213 and 216 are capacitors for bypass, and the resistor 207 and capacitor 210, and resistor 217 and capacitor 220 compose a network used for the decoupling of the power source. Capacitor 208 and coil 209 make up a tank circuit of a crystal oscillation circuit composed of transistor 224, crystal resonator 204, feedback capacitance 201 and elements.

The resonant frequency of this tank circuit is selected to be near the fundamental resonant frequency of the crystal resonator 204 or an odd integral multiple of its fundamental frequency. In the former case, it oscillates at the fundamental resonant frequency, and in the latter case it is its overtone resonant frequency. The transistor 214 is responsible for amplifying or multiplying. Capacitor 218 and coil 219, and capacitor 222 and coil 223 respectively make up tank circuits, whose resonant frequency is the pilot frequency, and are intended to remove the spurious components occurring in the transistor 214, together with coupling capacitor 221.

Figure 3:
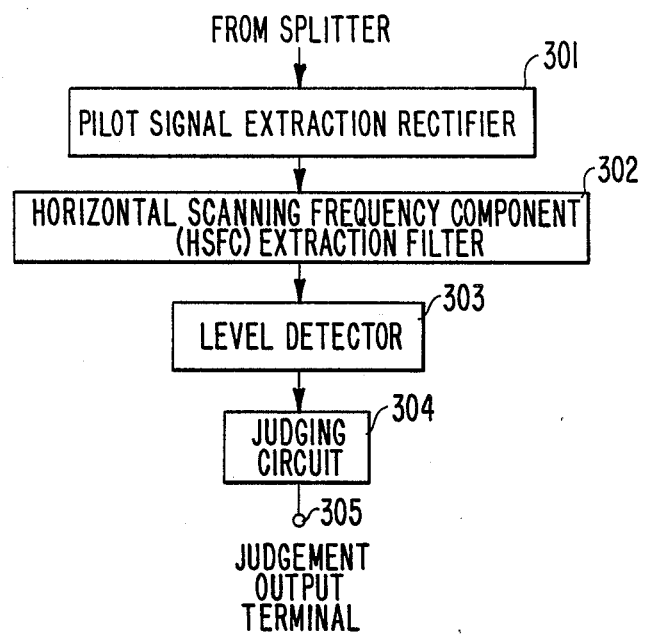
FIG. 3 is a block diagram showing the distortion detecting circuit 106 in FIG. 1.

FIG. 3 is a block diagram showing a construction of distortion detecting circuit 106. Element 301 is a pilot signal extraction rectifier which removes the cross-modulated pilot signal and detects the envelope. Element 302 is a horizontal scanning frequency component (HSFC) extraction filter which extracts the fundamental wave component or its higher harmonic component from the horizontal scanning frequency component in the output signal from the pilot signal extraction rectifier 301. Element 303 is a level detector for detecting the level of output signal from the horizontal scanning frequency component extraction filter 302. Element 304 is a judging circuit for delivering a failure signal to the judgement output terminal 304 when the output of the level detector 303 exceeds a certain threshold level.

Hereinafter, the pilot signal extraction rectifier 301, horizontal scanning frequency component extraction filter 302, level detector 303, and judging circuit 304, which are constituent elements of the block diagram in FIG. 3 showing the construction of the distortion detecting circuit 106, are described in more detail while referring to the practical circuit diagrams.

Figure 4:
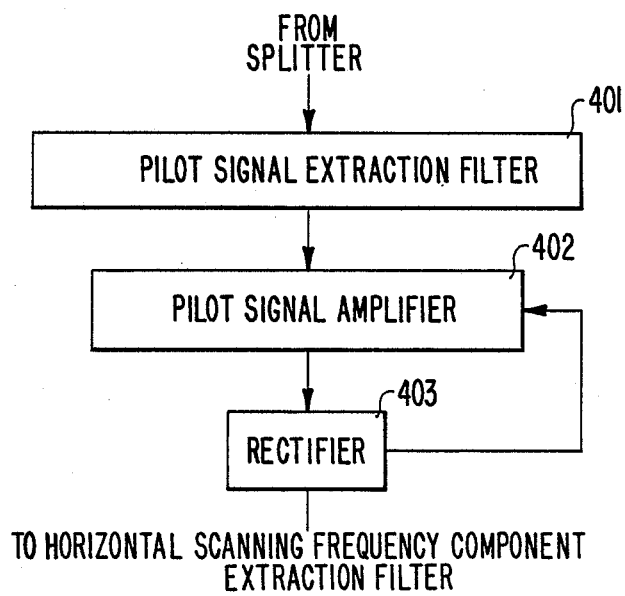
FIG. 4 is a block diagram showing a first example of the pilot signal extraction detector 301 shown in FIG. 3.

FIG. 4 is a block diagram showing a first example of the pilot signal extraction rectifier 301.

Element 401 is a pilot signal extraction filter which extracts the pilot signal. The pass band of this filter must contain the sideband corresponding to the fundamental wave of a higher harmonic of the horizontal scanning frequency ($f_H$) to be extracted by the horizontal scanning frequency component extraction filter 302. Examples of signal spectra of various elements are shown in FIG. 5. Here it is shown that the horizontal scanning frequency component extraction filter extracts the fundamental wave component of $f_H$ or the horizontal scanning frequency, and in this case, the pilot signal extraction filter 401 must pass the pilot carrier and one of the sidebands spaced apart by $\pm f_H$, or preferably, both of them. Furthermore, in order to prevent distortion in the pilot signal amplifier 402 and rectifier 403, transmission signals other than the pilot signal, in particular, television signals, must be sufficiently attenuated. This pilot signal extraction filter 401 may be composed of a resonant circuit or LC filter composed of coils and capacitors, or a filter using a distribution constant circuit as represented by a helical resonator, crystal filter, ceramic filter, or SAW filter.

Element 402 is a pilot signal amplifier which amplifies the pilot signal. Element 403 is a rectifier which detects the envelope of the pilot signal after having been extracted by the pilot signal extraction filter 401 and amplified by pilot signal amplifier 402. The direct-current component of the output of the rectifier 403 indicates the carrier level of the pilot signal, and so as to make it constant, an automatic gain control (AGC) is effected to control the amplitude of the pilot signal amplifier 402. In this way, the level of the pilot signal applied to the rectifier 403 is kept constant, thereby holding constant the distortion detection sensitivity. As the rectifier 403, various rectifier circuits using diodes, a square rectifier, or a synchronous rectifier may be used.

Figure 6:
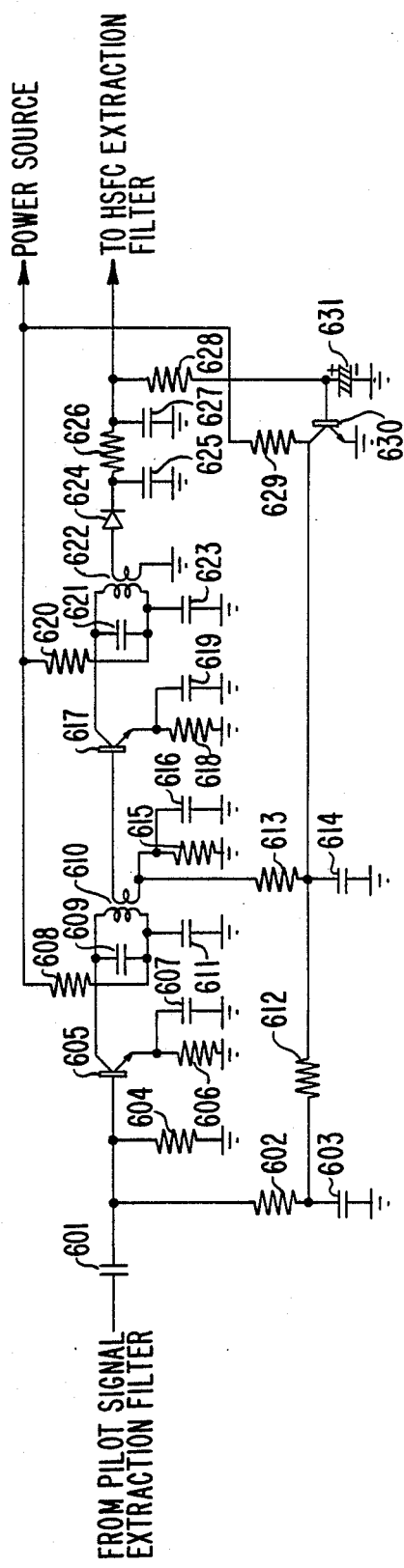

FIG. 6 is a circuit diagram as an example of pilot signal amplifier 402 and rectifier 403. The pilot signal amplifier 402 is realized by resistors for bias 602, 604, 606, 613, 615, and 618, and capacitors for bypass 601, 607, 616, and 619, and resistors and capacitors for power source decoupling 608, 611, 620, and 623, and resonance circuits tuned to pilot signal frequency 609, 610, 621, and 622, and transistors 605 and 617. The rectifier 403 is realized by a half-wave rectifier circuit composed of diode 624, and resistors and capacitors 625, 626, and 627 which make up the filter to remove the higher frequency components. The direct-current component of the output of the rectifier output by the filter composed of resistor 628 and capacitor 631 is amplified by the transistor 630 and load resistor 629, and is applied to the transistors 605 and 617 by way of a decoupling circuit composed of capacitors 614 and 603, and resistor 612 to change their base voltage, thereby effecting gain control.

FIG. 7 is similarly a circuit diagram of another example of the pilot signal amplifier 402 and rectifier 403. What is different from the circuit shown in FIG. 6 is that the synchronous rectification is effected by using an IC 719. In the rectifier 403, if a diode having an extreme nonlinearity as shown in FIG. 6 is used, the pilot signal is subjected to cross modulation by the television signal which has leaked, not being cut by the pilot signal extraction filter 401, and the sensitivity of distortion detection is lowered as a result. Therefore, as the rectifier 403, by using a synchronous rectifier which operates linearly, the detection sensitivity can be improved. In FIG. 7, an integrated circuit 719 comprises an IF amplifier, and a PLL detector, and an AGC circuit and is commercially available as part number AN 5125; capacitors 703, 704, 705, 706, and 715 are for bypass, capacitors 707 and 714, and coils 708 and 713 are for power source decoupling; element 702 is a time constant capacitor for AGC; element 709 is a capacitor for a lock detection filter for the PLL (phase locked loop), and a resonant circuit composed of capacitor 716 and coil 717 is a resonant circuit for oscillation of the VCO (voltage controlled oscillator) resonating at the pilot signal frequency.

Figure 8:
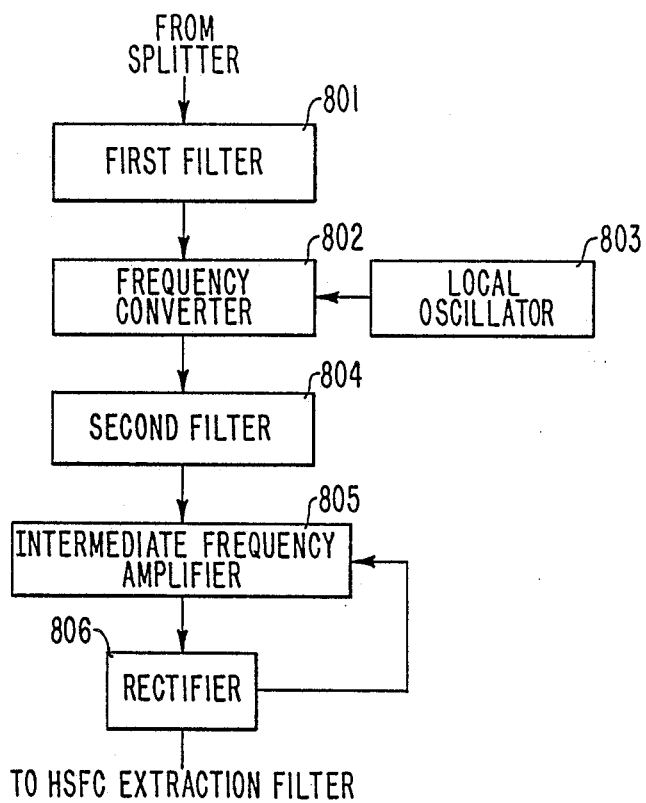
FIG. 8 is a block diagram showing a second example of the pilot signal extraction rectifier 301 shown in FIG. 3.

FIG. 8 is a block diagram showing a second example of a pilot signal extraction rectifier 301. In the first example shown in FIG. 4, the structure is simple, but it is hard to realize the pilot signal extraction filter 401 when the frequency of the pilot signal is high or there is a transmission signal very close to the pilot signal. Moreover, it is also hard to realize the pilot signal amplifier 402. In the second example shown in FIG. 8, the desired bandwidth and amplitude are easily realized by converting the pilot signal to a lower intermediate frequency. The individual parts are specifically described below.

Element 801 is a first filter to pass the pilot signal. This first filter 801 is intended to eliminate the transmission signal if contained in the image frequency. Incidentally, in order to reduce the occurrence of distortion at the frequency converter 802 mentioned later, it is necessary to attenuate transmission signals other than the pilot signal, especially television signals, by this filter. As the first filter 801, a resonant circuit or LC filter composed of coils and capacitors, or a filter using a distribution constant circuit such as helical resonator, or an SAW filter may be used.

Element 803 is a local oscillator for generating a local oscillation signal to convert the pilot signal to the intermediate frequency band. The difference between the local oscillation frequency and the pilot signal frequency is the intermediate frequency. Therefore, the local oscillation frequency may be either above or below the pilot signal frequency by the portion of the intermediate frequency. The circuit diagram is identical with that of FIG. 2 and is omitted here. However, the resonant frequency of the resonant circuits of elements 218, 219, 222, and 223 is the local oscillation frequency, and the resonant frequency of the resonant circuits 208 and 209 is the primary oscillation frequency of an integer fraction of the local oscillation frequency. The fundamental frequency of the crystal oscillator 204 or the overtone oscillation frequency is this primary oscillation frequency.

Figure 9:
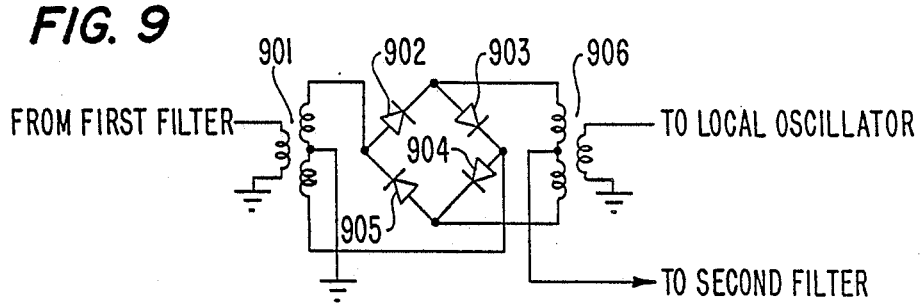
FIG. 9 is a circuit diagram of a double balanced mixer which is an example of the frequency converter 802 shown in FIG. 8.

Element 802 is a frequency converter to convert the frequency of the pilot signal to the intermediate frequency band. The frequency converter 802 is composed of one of either a bipolar transistor, junction FET, MOSFET, MESFET, and diode, and an element having a low distortion is preferred, and the structure of double balanced mixer is particularly preferable. A circuit example of a double balanced mixer using diodes is shown in FIG. 9. Elements 901 and 906 are bifilar transformers wound on troidal cores, and elements 902, 903, 904, and 905 are diodes having matched characteristics.

Element 804 is a second filter to remove signals other than the pilot signal converted to the intermediate frequency band. The passing bandwidth of this filter must contain, like the pilot signal extraction filter 401, the sideband corresponding to the fundamental wave or a higher harmonic of $f_H$ to be extracted by the horizontal scanning frequency component extraction filter 302. For example, when extracting $f_H$, it is necessary to pass the frequency-converted pilot signal carrier together with at least either the upper or lower sideband by $\pm f_H$ from it, or preferably both of them. This second filter 804 may be composed of a resonant circuit or LC filter made of coils and capacitors, a crystal filter, a ceramic filter, an SAW filter, or a mechanical filter.

Element 805 is an intermediate frequency amplifier, and element 806 is a rectifier. These blocks are exactly the same in their functions as the above-mentioned pilot signal amplifier 402 and rectifier 403, except that the input signal frequency is changed from the pilot signal frequency to the frequency-converted pilot signal frequency, that is, the intermediate frequency. Therefore, a practical example of such a circuit may be realized by changing the resonant frequency to the intermediate frequency in the resonant circuits 609, 610 and 621, 622 and 716, 717 in FIG. 6 and FIG. 7.

The next description relates to the horizontal scanning frequency component (HSFC) extraction filter 302.

This is a bandpass filter that extracts the frequency component of $f_H$ or $mf_H$ (where m is an integer not less than 2), and the passing bandwidth of this filter affects the sensitivity as the distortion detection. In order to detect the distortion problems until the cross modulation interference, that is, the window wiper interference is sensed visually, the passing bandwidth must be set at 200 Hz, for example, with the $f_H$ filter and 100 Hz or less with the $2f_H$ filter. Furthermore, in order to detect the distortion problems until the third order beat interference is sensed visually, the passing bandwidth must be set at 13 Hz with the $f_H$ filter, and 6 Hz or less with the $2f_H$ filter. It is also necessary to prevent the horizontal scanning frequency component to be extracted from being dislocated from the passing band, due to drift or deviation of $f_H$ or drift or deviation of the horizontal scanning frequency component extraction filter 302. The explanation continues below by referring to the circuit example.

Figure 10:
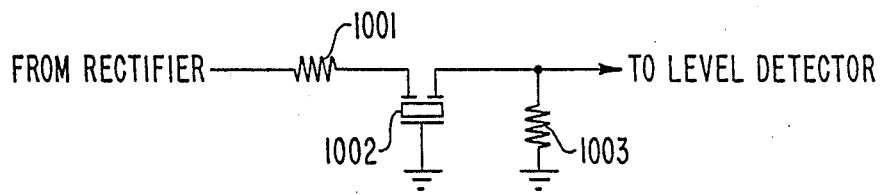

FIG. 10 shows a circuit example using a three-terminal filter element. Element 1001 is an input resistor element 1003 is a terminal resistor, and element 1002 is a three-terminal filter element. The filter element 1002 can be realized by a tuning fork type crystal resonator, or a mechanical filter or a ceramic filter. For example, when a tuning fork crystal resonator is used, the bandwidth is about 2 Hz with the $f_H$ filter. In the case of a mechanical filter, the bandwidth is about 20 Hz with the $f_H$ filter. The ceramic filter is considerably large in shape, and it is hard to obtain a narrow bandwidth. In order to obtain out-band attenuation, several stages of filter elements 1002 may be connected in series.

FIG. 11 and FIG. 12 are examples of circuits using two-terminal tuning fork crystal resonators. Elements 1101 and 1201 are input resistors; elements 1109 and 1209 are terminal resistors elements 1102, 1104, 1106, 1108, 1203, 1205, and 1207 are tuning fork crystal resonators, and elements 1103, 1105, 1107, 1109, 1202, 1204, 1206, and 1208 are capacitors used to form a filter. By such ladder circuits, the bandwidth of about 4 Hz with the $f_H$ filter and about 6 Hz with the $2f_H$ filter may be easily obtained, and the out-band attenuation is more than 60 dB with the four-element filter. The tuning fork crystal resonator is high in capacitance ratio and Q value, and is considerably narrow in passing bandwidth. With the $f_H$ filter, the bandwidth is about 4 Hz as compared with the required bandwidth of 13 Hz. If the drift or deviation of $f_H$ is large, a wider bandwidth may be desired, and for example, when composed as shown in FIG. 13, the bandwidth will be about twice as wide as that shown in FIG. 11 or FIG. 12. In this example, element 1301 is an input resistor; element 1307 is a terminal resistor, and elements 1302, 1303, 1304, 1305, and 1306 are tuning fork crystal resonators.

Next, the level detector 303 is described while referring to a practical circuit.

Figure 14:
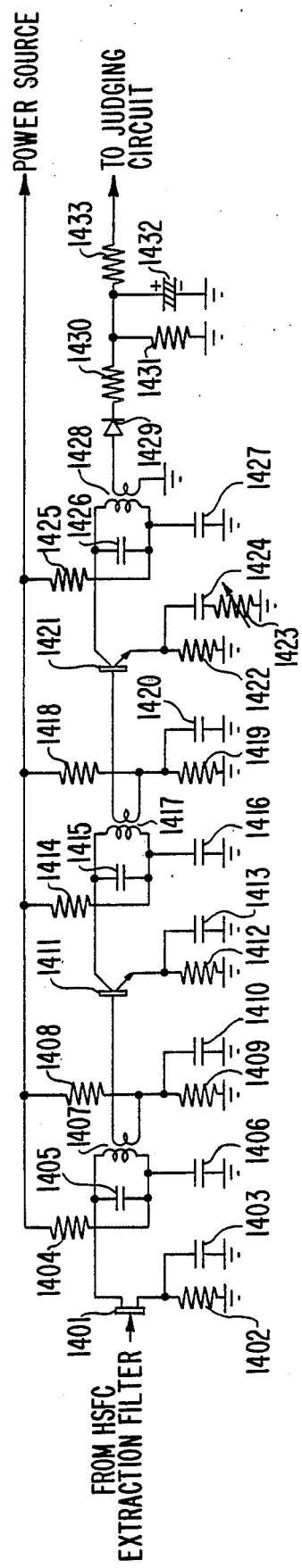
FIG. 14 is a circuit diagram showing an example of the level detector 303 shown in FIG. 3.

FIG. 14 is a circuit diagram showing an example of the level detector 303. It is roughly divided into a three-stage amplifier structure comprising junction FET 1401, and transistors 1411 and 1421, and a rectifier consisting of diode 1429. In the amplifier structure, elements 1402, 1408, 1409, 1412, 1418, 1419, and 1422 are resistors for bias; elements 1404, 1406 and 1414, 1416 and 1425, and 1427 are resistors and capacitors for power source decoupling; elements 1405, 1407 and 1415, 1417 and 1426, and 1428 are capacitors and coils of a resonant circuit to resonate at the frequency of the components to be extracted by the horizontal scanning frequency component extraction filter 302; elements 1403, 1410, 1413, 1420, 1424 are capacitors for bypass; and element 1423 is a variable resistor for gain control. When the tuning fork crystal resonators are used in the horizontal scanning frequency component extraction filter 302, its input and output impedances are about several hundred kilohms, and the initial amplifying stage must use a junction FET or MOS FET or an emitter follower. In the rectifying stage, element 1430 is a charging resistor element 1431 is a discharging resistor element 1432 is a smoothing capacitor, and element 1433 is an output resistor. The time constant of the rise of the output signal is the product of parallel resistances of resistors 1430 and 1431 and the capacitance of capacitor 1432, while the time constant of the fall is similarly the product of the capacitance of capacitor 1432 and the resistance of resistor 1431. If plural television signals are transmitted as the transmission signals, the output signal may pulsate due to a slight difference in $f_H$ in the television signals, and it is preferable to adjust the peak-hold characteristic so that the time constant of the rise may be shorter than that of the fall.

Finally the judging circuit 304 is explained together with a practical circuit.

Figure 15:
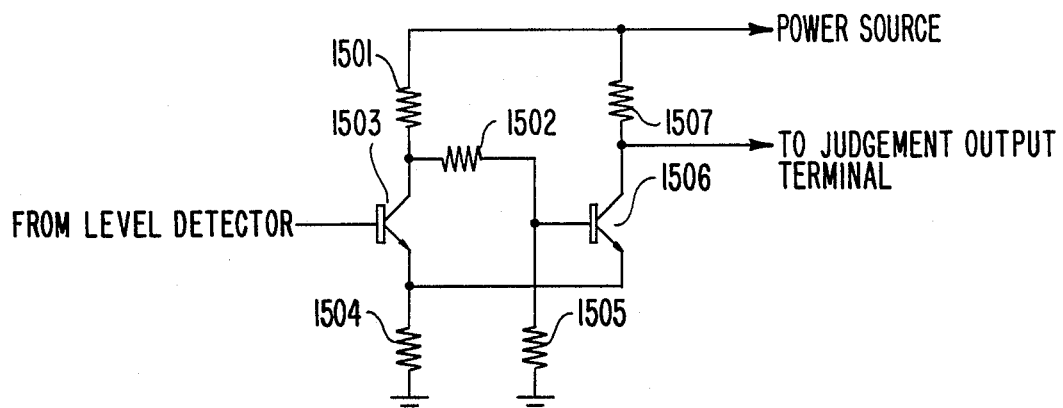
FIG. 15 is a circuit diagram showing an example of the judging circuit 304 shown in FIG. 3.

The judging circuit 304 is intended to determine abnormalities at a certain threshold level when the output signal of the level detector 303 elevates. In order to prevent misoperation due to impulses or the above-mentioned pulsation, it is composed of a switching circuit having a hysteresis characteristic. As an example, a Schmitt circuit is shown in FIG. 15. Elements 1501 and 1507 are collector resistors; elements 1503 and 1506 are transistors for switching; elements 1502 and 1505 are voltage dividing resistors for coupling from transistor 1503 to transistor 1506; and elements 1504 is an emitter resistor. Feedback is effected by the common emitter resistor 1504, and a hysteresis occurs in the threshold voltage.

Relating now to a practical example of the transmission system 104 and the entire transmission system, an application of the distortion surveillance apparatus of the first embodiment of this invention used in an entire transmission system is shown.

Figure 16:
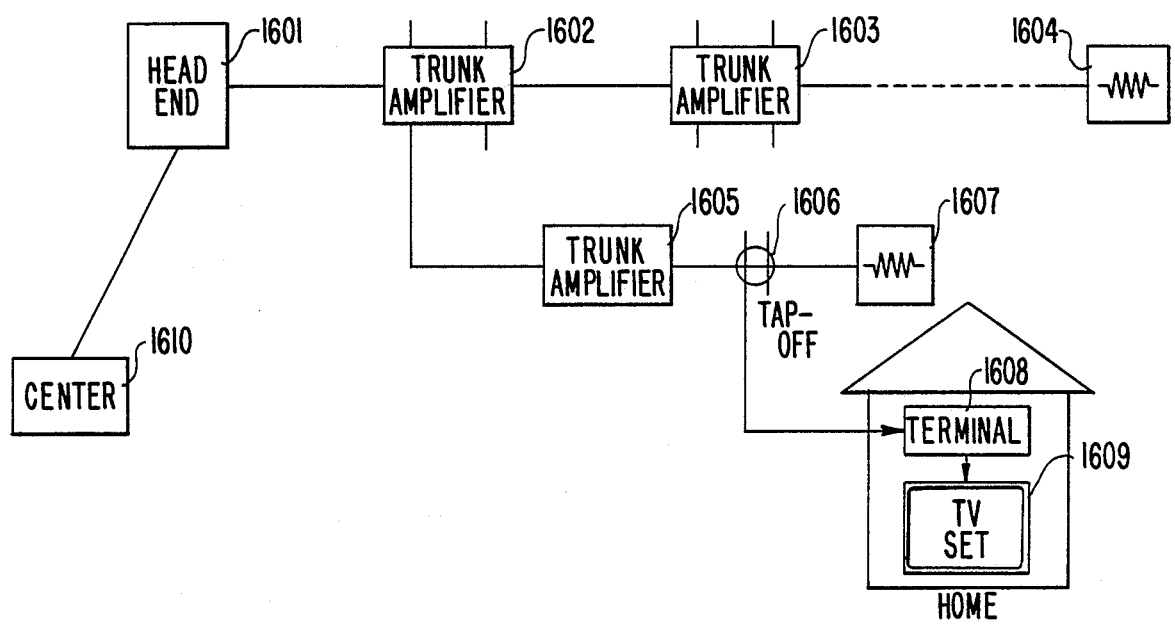
FIG. 16 is an example of a CATV transmission system.

FIG. 16 shows a structure of a transmission system of a typical CATV (cable television) system used as an example of the transmission system of television signals. In FIG. 16, element 1601 is a head end; elements 1602, 1603 and 1605 are trunk amplifiers; element 1606 is a tap-off; element 1604 and 1607 are terminators; element 1608 is a terminal unit element 1609 is a television set, and element 1610 is the center. The down transmission signals including television signals are first sent from the center 1610 to the head end 1601 by way of a radio circuit, optical fiber or satellite. The head end 1601, receiving these down transmission signals, possesses the function of transmitting them to the coaxial line, together with on-air reception signals when re-transmitting on-air signals, or with signals for the remote surveillance system (called a status monitor) of transmission line to be mentioned later and various data signals to the terminal unit 1608; by multiplexing the frequency. The down transmission signals sent out from the head end 1601 onto the coaxial line are transmitted while compensating for the attenuation in the coaxial line by trunk amplifiers 1602, 1603, and 1605, as running through trunk amplifiers 1602 and 1603, terminator 1604, or trunk amplifiers 1602 and 1605 and terminator 1607. On the way of the coaxial line there is a splitter called a tap-off 1606, and the down transmission signals are branched off by the tap-off 1606, and enter the terminal unit 1608 in each home. The terminal unit 1608 possesses several functions, such as television signal tuning function, frequency converting function, descrambling function if the television signals are scrambled, and communication function with the head end. This explanation related to the down transmission in the direction from the center 1610 to the terminal unit 1608 by way of head end 1601, trunk amplifiers 1602 and 1605, and tap-off 1606, but there are also many two-way transmission systems capable of transmitting also in the up direction in the reverse way (the CATV transmission system is, for example, mentioned in "Technology of CATV" by Genzaburo Kuraishi).

The combining network 103, pilot signal generator 102, and splitter 105 in FIG. 1 may be placed at any position in FIG. 16. However, with respect to the flow of signals, the combining network 103 must be placed at the upstream side, and the splitter 105 at the downstream side. The distortion surveillance apparatus in the first embodiment of this invention may be applied to either the up or down transmission system, but amplitude-modulated television signals must be contained in the transmission signal flowing in the transmission system to be surveyed.

Furthermore, sharing a single pilot signal fed from the combining network 103 and pilot signal generator 102, plural sets of splitters 105 and distortion detecting circuits 106 may be prepared. For example, in FIG. 16, by placing the combining network 103 and pilot signal generator 102 at the head end 1601, and the splitter 105 and distortion detecting circuit 106 in the trunk amplifiers 1602, 1603, or 1605 or terminators 1604 or 1607 or the tap-off 1606 or terminal unit 1608, the down transmission line from the head end 1601 to each splitter 105 may be surveyed. In this case, it is also possible to use this pilot signal as a reference level signal for automatic adjustment of the level of transmission system parts, which will be further described below as a second embodiment of this invention.

Furthermore, it may be also possible to use plural sets of combining networks 103 and pilot signal generators 102 for generating pilot signals which are mutually different in frequency, and placing them at various positions in the transmission system, and installing a set or plural sets of corresponding flow splitters 105 and distortion detecting circuit 106 individually.

Further descriptions are devoted to an example of distortion surveillance of a down transmission system from the head end 1601 to the installed trunk amplifiers by placing the combining network 103 and pilot signal generator 102 at the head end 1601 and the splitter 105 and distortion detecting circuit 106 in the trunk amplifiers 1602, 1603, and 1605.

Figure 17:
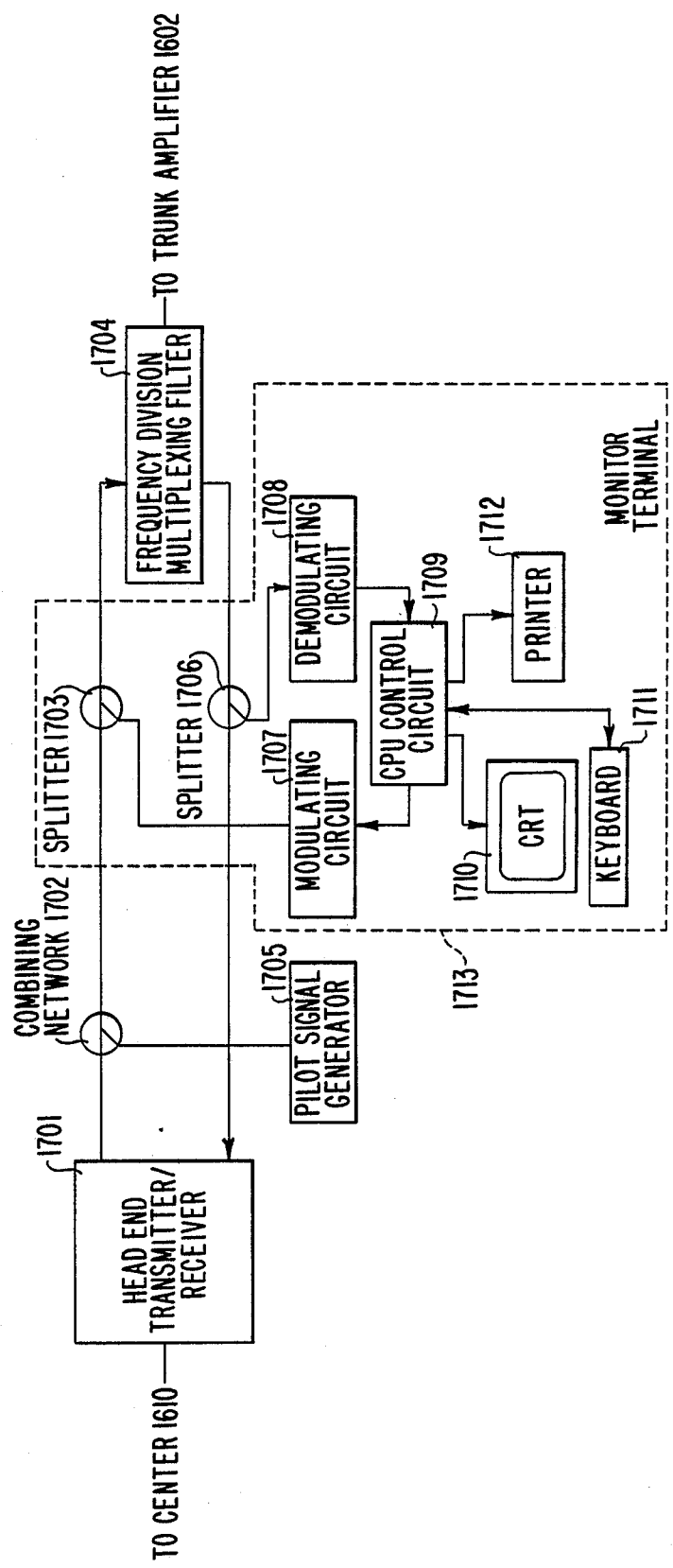
FIG. 17 is a block diagram showing the configuration of the head end 1601 shown in FIG. 16.

FIG. 17 shows the inside of head end 1601. Element 1701 is a head end transmitter/receiver which sends out the television signals or data signals from the center by frequency multiplexing, or receives the up television signals or data signals. Element 1704 is a frequency division multiplexing filter which separates the up and down transmission signals usually assigned in the low range and high range respectively by making use of the difference in frequency. The frequency division multiplexing filter 1704 is composed of a low-pass filter and a high-pass filter, or it may be composed of a mere combining network.

This is the construction of an ordinary head end. The example shown in FIG. 17 also comprises a surveillance terminal 1713 possessing the communication function to obtain information of the occurrence of problems and the function to analyze and display the information, and combining network 1702 and pilot signal generator 1705 which are exactly identical with the combining network 103 and pilot signal generator 102 in FIG. 1.

The surveillance terminal 1713 is composed of a transmission modulation circuit 1707, a reception demodulation circuit 1708, a combining network 1703 and splitter 1706 for receiving problem detection information from the trunk amplifiers, a CPU control circuit 1709 for exchanging commands with the trunk amplifiers by way of the communication means, and obtaining, analyzing and compiling the problem detection information, and CRT 1710, keyboard 1711 and printer 1712 for communicating with the operator. Such a remote monitoring system of a transmission line is called a status monitor (for example, IEEE Trans. CATV-4, No. 3, pp. 103-110, "An Advanced Micro Processor Based CATV Status Monitor System", E. S. Walker and T. M. Alldread).

Figures 18, 19:
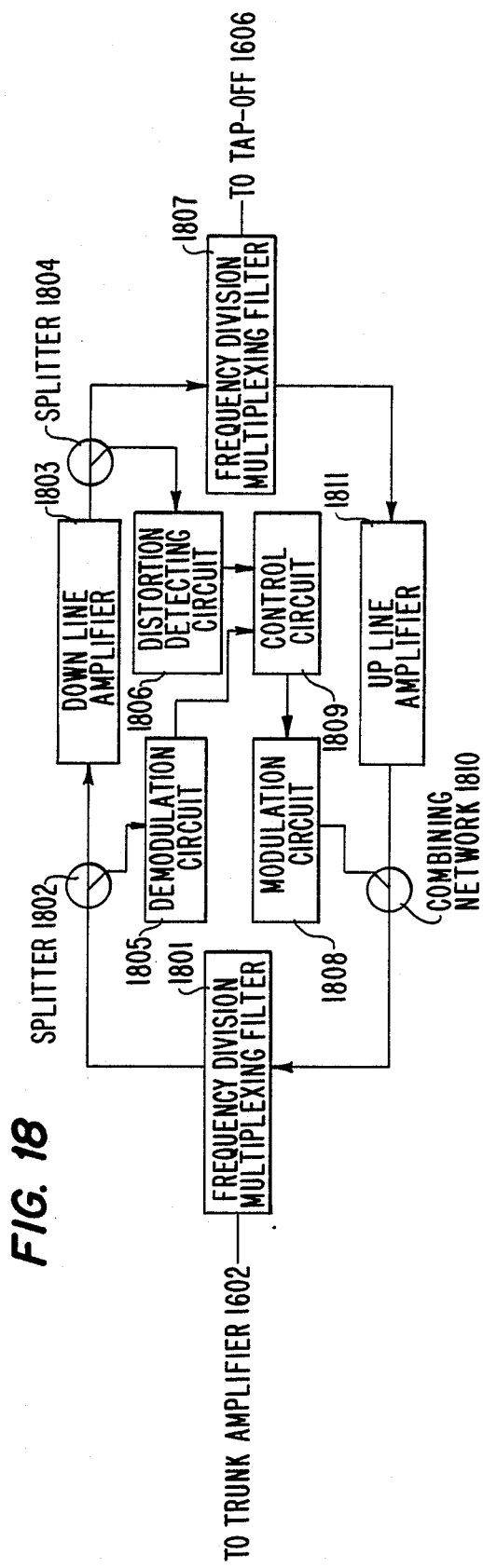
FIG. 18 is a block diagram showing the configuration of trunk amplifier 1605 in FIG. 16.
FIG. 19 is a block diagram showing a distortion surveillance apparatus according to a second embodiment of this invention.

On the other hand, FIG. 18 shows the inside of the trunk amplifier 1605, in which the frequency division multiplexing filters 1801 and 1807 are same as the filter 1704 shown in FIG. 17. The down line amplifier 1803 and up line amplifier 1811 are for compensating for the frequency characteristic and attenuation of the coaxial line. The splitter 1804 and distortion detecting circuit 1806 are same as the splitter 105 and distortion detecting circuit 106 shown in FIG. 1. Element 1802 is a splitter and element 1810 is a combining network, and the reception demodulation circuit 1805 responds to the signal output from the transmission modulation circuit 1707, while, similarly, the signal output from the transmission modulation circuit 1808 responds to the reception demodulation circuit 1708. The control circuit 1809 exchanges commands with the CPU control circuit 1709 by using transmission modulation circuits 1707 and 1808, reception demodulation circuits 1708 and 1805, combining networks 1810 and 1703, and splitters 1706 and 1802, and transmits the problem detection information from the distortion detecting circuit 1806 to the surveillance terminal 1713.

The distortion surveillance apparatus in the thus constructed first embodiment of this invention can accurately detect the problem due to a distortion increase of the transmission system, by detecting the level of a signal of horizontal scanning frequency or its higher harmonic component, out of the cross modulation components from the transmitted television signal to the pilot signal, and judging it abnormal by the elevation of this level.

FIG. 19 is a block diagram showing a construction of distortion surveillance apparatus in a second embodiment of this invention.

Element 1901 is an input terminal; element 1903 is a combining network, 1902 is a pilot signal generator, 1904 is a transmission system A; element 1905 is an attenuator; element 1906 is a transmission system B; element 1907 is a splitter; element 1908 is a distortion detection control circuit, and element 1909 is an output terminal. The input terminal 1901, combining network 1903, pilot signal generator 1902, splitter 1907, and output terminal 1909 are exactly the same as those in the first embodiment, that is, input terminal 101, combining network 103, pilot signal generator 102, splitter 105, and output terminal 107 in FIG. 1. What is different from the first embodiment is that an attenuator 1905 is inserted on the way of transmission system 104 to divide the portion of transmission system 104 before the attenuator 1905 into the transmission system A 1904 and the portion after the attenuator 1905 into the transmission system B 1906. In a special case incidentally, transmission system A 1904 or transmission system B 1906 may be omitted. Besides, the distortion detection control circuit 1908 which produces a signal to control the attenuator 1905 and detects distortion is slightly different from the distortion detecting circuit 106.

Details of the attenuator 1905 and distortion detection control circuit 1908 are described below.

Figure 20:
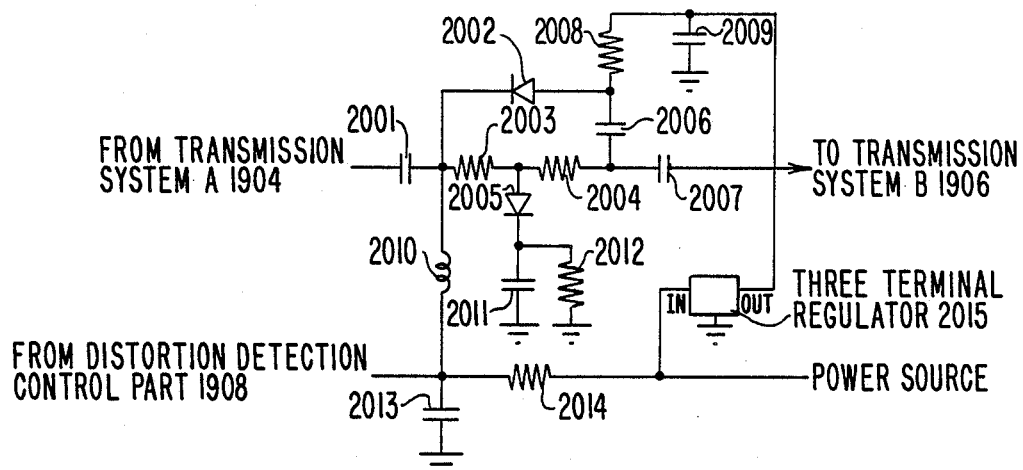
FIG. 20 is a circuit diagram showing an example of the attenuator 1905 shown in FIG. 19.

As the attenuator 1905, a wide band variable attenuator using PIN diodes is employed. Its circuit example is shown in FIG. 20, in which elements 2001, 2006, 2009, 2011, 2007, and 2013 are capacitors for bypass; elements 2008 and 2012 are resistors for bias; elements 2003 and 2004 are resistors equal to the line impedance; element 2010 is a choke coil for cutting off high frequency signals; element 2014 is a load resistor of control signal; element 2015 is a three-terminal regulator for obtaining a reference voltage lower than the supply voltage so as to apply also reverse bias to the PIN diodes; and element, 2002 and 2005 are PIN diodes.

Figure 21:
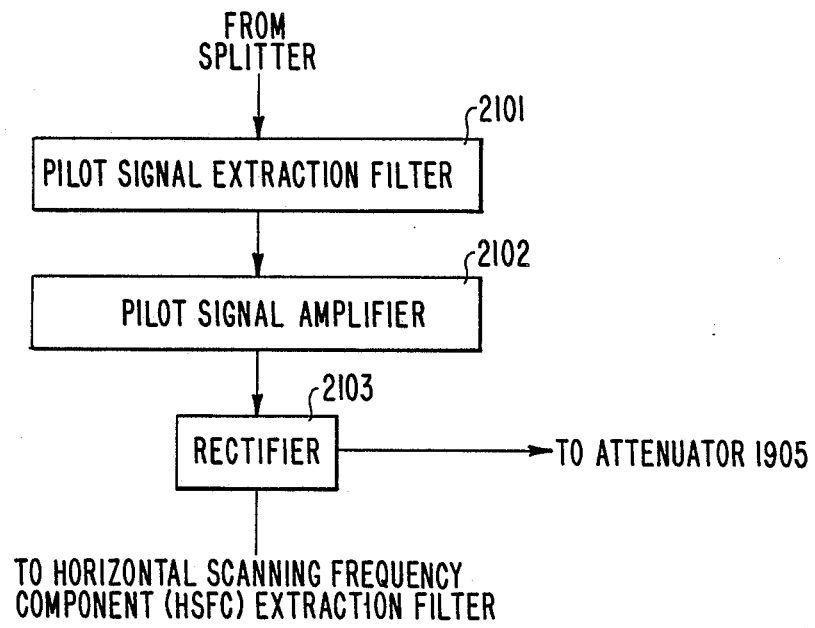

The internal structure of the distortion detection control circuit 1908 is similar to that of the first embodiment, that is, the construction shown in FIG. 3, except that the internal structure of the pilot signal extraction rectifier 301 is slightly different. The internal structure of pilot signal extraction rectifier 301 was intended, in the first embodiment, to keep the pilot signal carrier level constant by varying the amplitude of the pilot signal amplifier 402, intermediate frequency amplifier 805, in FIG. 4 or FIG. 8, by using the direct-current component of the output the rectifiers 403 or 806. In the second embodiment, the pilot signal carrier level is kept constant by varying the attenuation of the attenuator 1905. FIG. 21 or FIG. 22 shows an internal construction of the pilot signal extraction rectifier 301 in the second embodiment. As mentioned above, the pilot signal extraction filter 2101, rectifier 2103, first filter 2201, frequency converter 2202, local oscillator 2203, second filter 2204, and rectifier 2206 are identical with the pilot signal extraction filter 401, rectifier 403, first filter 801, frequency converter 802, local oscillator 803, second filter 804, and rectifier 806 in FIG. 4 or FIG. 8. What is different is that the amplitude of pilot signal amplifier 2102 and intermediate frequency amplifier 2204 is constant.

Figure 23:
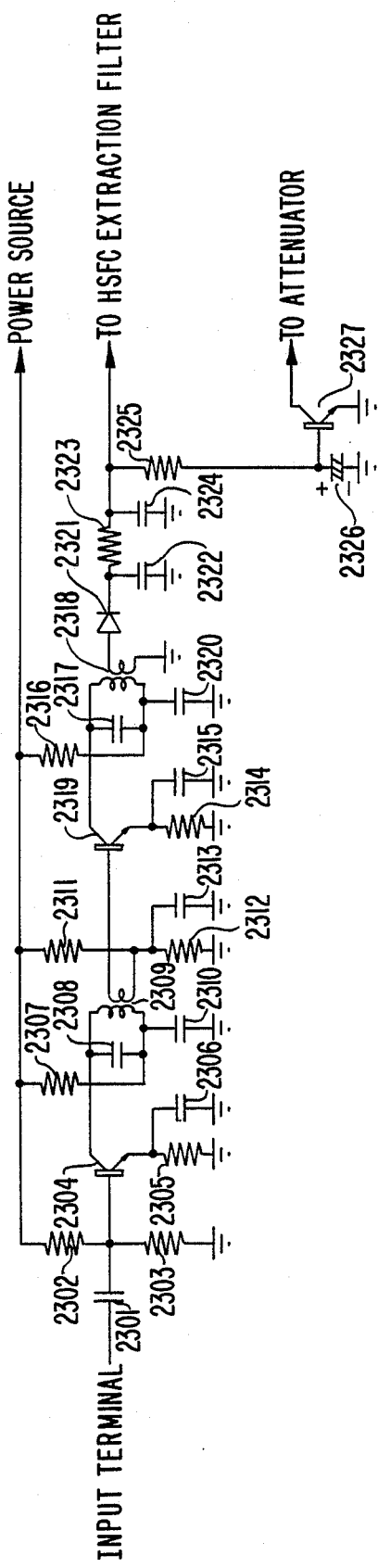
FIG. 23 is a circuit diagram showing examples of the pilot signal amplifier 2102 and rectifier 2103 shown in FIG. 21 or the intermediate frequency amplifier 2205 and rectifier 2206 shown in FIG. 22.

FIG. 23 shows a circuit diagram of an example of the pilot signal amplifier 2102 and rectifier 2103 or intermediate frequency amplifier 2205 and rectifier 2206. Elements 2302, 2303, 2305, 2311, 2313, and 2314 are resistors for bias; elements 2301, 2306, 2313, and 2315 are capacitors for bypass; elements 2307 and 2310, 2316 and 2320 are respectively resistors and capacitors for power source decoupling; elements 2308 and 2309, 2317 and 2318 are respectively capacitors and coils or resonant circuits which resonate at the pilot signal frequency or intermediate frequency; and elements 2304 and 2319 are transistors—these components are combined to make up the pilot signal amplifier 2102 or intermediate frequency amplifier 2205. Rectifier 2103 or 2206 of the half-wave rectifying type is composed of diode 2321 and smoothing circuits 2322, 2323, 2324. The direct-current component of the output of the rectifier separated by the filter composed of resistor 2325 and capacitor 2326 is amplified by the transistor 2327 to become a control signal which is output to the attenuator 1905. Meanwhile, the rectifiers 2103 and 2206 may be replaced by a synchronous rectifier as shown in the first embodiment.

Figure 24:
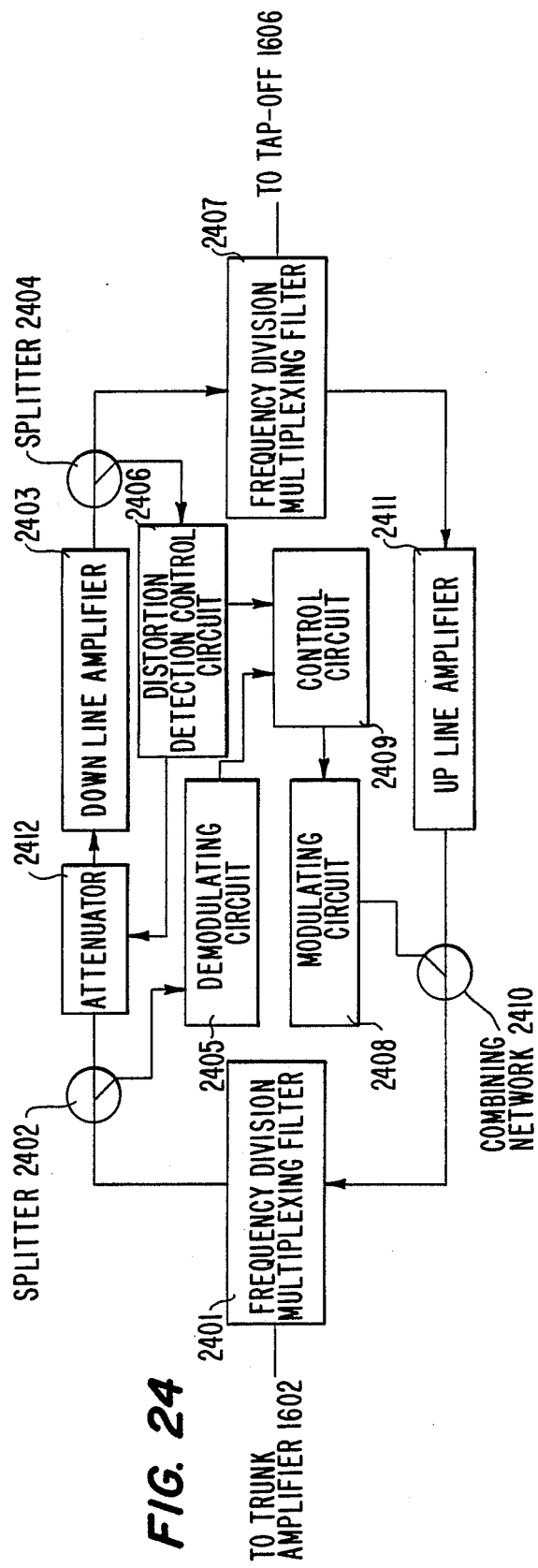
FIG. 24 is a block diagram showing the trunk amplifier 1605 shown in FIG. 16 in which is installed the distortion surveillance apparatus according to the second embodiment of this invention.

The distortion surveillance apparatus in the thus composed second embodiment of this invention can accurately detect the problem due to a distortion increase in the transmission system as in the first embodiment, and in FIG. 19 the function to keep an optimum level of the output of transmission system B 1906 or output terminal 1909 is realized by sharing almost all of the block for distortion detection. Meanwhile, as an example, a construction of a trunk amplifier 1605 having the splitter 1907 and distortion detection control circuit 1908 placed in the position of the trunk amplifier 1605 in FIG. 16 is shown in FIG. 24. The frequency division multiplexing filters 2401 and 2407, splitter 2402, down line amplifier 2403, up line amplifier 2411, combining network 2410, reception demodulation circuit 2405, transmission modulation circuit 2408, and control circuit 2409 are same as in the construction in FIG. 18. The attenuator 2412, splitter 2404, distortion detection control circuit 2406, and down line amplifier 2403 respectively correspond to the attenuator 1905, splitter 1907, distortion detection control circuit 1908, and transmission system B 1906 in FIG. 19.

Figure 25:
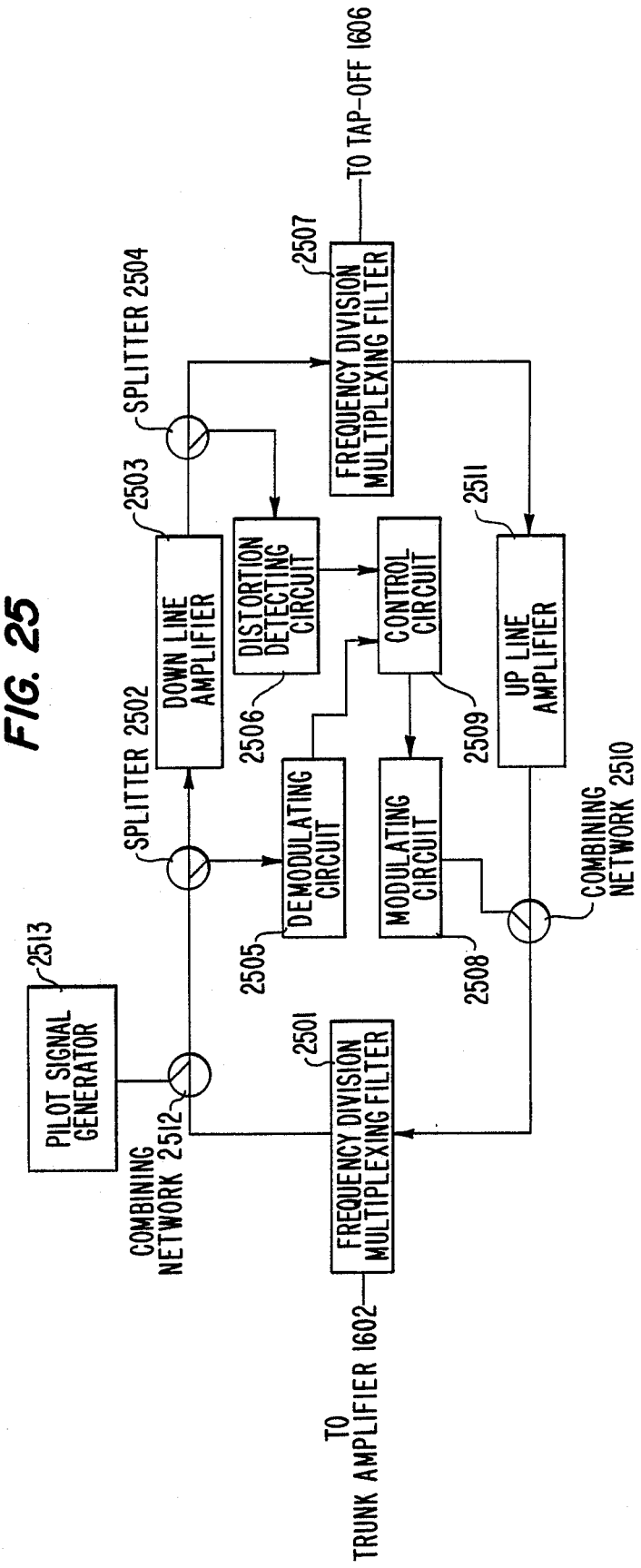
FIG. 25 is a block diagram showing the trunk amplifier 1605 shown in FIG. 16 in which is installed a distortion surveillance apparatus according to a third embodiment of this invention.

FIG. 25 is a block diagram showing an internal structure of a trunk amplifier installed in the distortion surveillance apparatus in a third embodiment of this invention. This trunk amplifier is fashioned after the trunk amplifier 1605 in FIG. 16.

In FIG. 25, elements 2501 and 2507 are frequency division multiplexing filters; element 2502 and 2504 are splitters; element 2503 is a down line amplifier; element 2506 is a distortion detection circuit; element 2505 is a reception demodulation circuit; element 2508 is a transmission modulation circuit; element 2509 is a control circuit; element 2510 is a combining network; and element 2511 is an up transmission amplifier, which are all identical to those elements shown in FIG. 18. In this embodiment, what is different is that a pilot signal generated in the pilot signal generator 2513 is injected by placing a combining network 2512 between the frequency division multiplexing filter 2501 and down line amplifier 2503.

Figure 26:
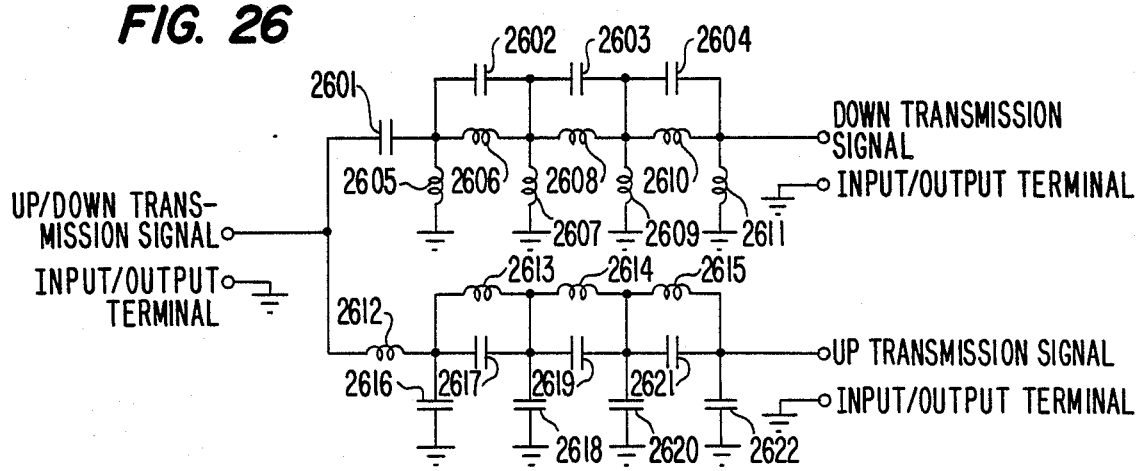
FIG. 26 is a circuit diagram showing an example of the frequency division multiplexing filters 2501 and 2507 shown in FIG. 25.

FIG. 26 shows an example of circuit diagram of the frequency division multiplexing filter 2501 or 2507. Capacitors 2601, 2602, 2603, and 2604, and coils 2605, 2606, 2607, 2608, 2609, 2610, and 2611 form an eight-element elliptical function high-pass filter. In the CATV coaxial cable transmission system, the high range side is used for down transmission and the low range side used for up transmission, and this high-pass filter allows the passage of down transmission signals and cuts off up transmission signals. On the other hand, coils 2612, 2613, 2614, and 2615, and capacitors 2616, 2617, 2618, 2619, 2620, 2621, and 2622 form an eight-element elliptical function low-pass filter, which allows the passage form up transmission signals and cuts off down transmission signals. In the CATV coaxial cable transmission system, the upper end of the up transmission signal band and the lower end of the down transmission signal band are determined mainly by these filters. In the transient interval between the passing range and cut-off range of these filters, since the group delay characteristic and other properties are not excellent, there is a frequency region not used in either the up or down transmission, called the guard band, between the up transmission band and down transmission band.

If the pilot signal feed point, that is, the combining network 2512, is placed ahead of the frequency division multiplexing filter 2501, it was necessary to select the pilot signal frequency within the transmission band so that the pilot signal could pass through this filter. But in this third embodiment, the upper or lower side region may be used in an operating range of down line amplifier 2503. In particular, within the guard band, since there is no other transmission signals, the frequency of the desired transmission signal is not consumed by the pilot signal, or it is easier to extract the pilot signal because there are no signals close thereto. This explanation related to the example of a down transmission, and the same holds true with the up transmission if television signals are contained in the up transmission.

What is claimed is:

1. A distortion surveillance apparatus used in a transmission system for signals including a television signal, comprising:

means coupled to a first specified position in said transmission system for supplying a pilot signal to said transmission system;

first extraction means coupled to a second specified position in said transmission system for extracting said pilot signal which has been subjected to a cross modulation with said television signal via a nonlinearity of said transmission system between said first and second specified positions;

rectifying means for obtaining an envelope of said cross modulated pilot signal from an output signal of said first extraction means;

second extraction means for extracting from said envelope at least a signal component of a horizontal scanning frequency of television signal and its harmonic components;

level detection means for detecting a level of a signal extracted by said second extraction means; and judging means for producing a signal indicating an occurrence of abnormal signal distortion increase when said level detected by said level detection means becomes abnormally large.

2. The apparatus as set forth in claim 1, wherein said first extraction means comprises a pilot signal extraction filter which allows to pass a pilot signal frequency.

3. The apparatus as set forth in claim 1, wherein said first extraction means comprises a first filter to attenuate an image frequency, a frequency converter to convert an output signal of said first filter to an intermediate frequency band, a local oscillator to supply a local oscillation signal to said frequency converter, and a second filter which allows to pass said pilot signal converted to said intermediate frequency band.

4. The apparatus as set forth in claim 3, wherein said frequency converter is a double balanced mixer.

5. The apparatus as set forth in claim 1, further comprising means to keep constant the level of said cross modulated pilot signal, which controls a gain of an amplifier to amplify said cross modulated pilot signal by using a direct-current component of the output signal of said rectifying means.

6. The apparatus as set forth in claim 1, further comprising means to keep constant the level of said cross modulated pilot signal, which controls an attenuation of an attenuator installed in said transmission system between said first and second specified positions by using a direct-current component of the output signal of said rectifying means.

7. The apparatus as set forth in claim 6, wherein said attenuator comprises PIN diodes.

8. The apparatus as set forth in claim 1, wherein said rectifying means comprises a rectifier circuit using diodes and a smoothing circuit.

9. The apparatus as set forth in claim 1, wherein said rectifying means comprises a synchronous rectifier.

10. The apparatus as set forth in claim 1, wherein said second extraction means extracts the fundamental wave component of the horizontal scanning frequency of said television signal.

11. The apparatus as set forth in claim 1, wherein said second extraction means extracts the harmonic components of the horizontal scanning frequency of said television signal.

12. The apparatus as set forth in claim 1, wherein said second extraction means comprises a three-terminal tuning fork type crystal filter.

13. The apparatus as set forth in claim 1, wherein said second extraction means comprises a three-terminal mechanical filter.

14. The apparatus as set forth in claim 1, wherein said second extraction means comprises a ceramic filter.

15. The apparatus as set forth in claim 1, wherein said second extraction means comprises a crystal filter having a ladder structure in which two-terminal tuning fork crystal resonators are arranged in series and capacitors are arranged in parallel.

16. The apparatus as set forth in claim 1, wherein said second extraction means comprises a crystal filter having a ladder structure in which two-terminal tuning fork crystal resonators are arranged in parallel and capacitors are arranged in series.

17. The apparatus as set forth in claim 1, wherein said second extraction means comprises a crystal filter having a ladder structure in which two-terminal tuning fork crystal resonators are arranged in series and parallel.

18. The apparatus as set forth in claim 1, wherein said judging means comprises a switching circuit having a hysteresis characteristic at a threshold level to judge whether said level is normal or abnormal.

19. The apparatus as set forth in claim 1, wherein said transmission system is a CATV transmission system.

20. The apparatus as set forth in claim 19, wherein said CATV transmission system has a frequency division multiplexing filter which is installed at a position external to the part between said first and second specified positions.

21. The apparatus as set forth in claim 20, wherein the frequency of said pilot signal is out of a transmission frequency band determined by said frequency division multiplexing filter.

* * * * *